United States Patent
Kim et al.

(10) Patent No.: US 6,627,105 B1
(45) Date of Patent: Sep. 30, 2003

(54) METHOD OF FABRICATING A PIEZOELECTRIC CERAMIC

(75) Inventors: Tae Kyu Kim, Ichon (KR); Jum Soo Kim, Ichon (KR); Mun Hwa Lee, Sungnam (KR); Jong Woo Kim, Seoul (KR)

(73) Assignee: Shin & Kim, Seoul (KR)

( * ) Notice: Subject to any disclaimer, the term of this patent is extended or adjusted under 35 U.S.C. 154(b) by 2 days.

(21) Appl. No.: 09/722,110

(22) Filed: Nov. 27, 2000

(30) Foreign Application Priority Data

Dec. 27, 1999 (KR) .............................. 99-62928

(51) Int. Cl.[7] .............................................. C04B 35/491
(52) U.S. Cl. ................. 252/62.9 PZ; 501/134
(58) Field of Search ................... 252/62.9 PZ; 501/134

*Primary Examiner*—C. Melissa Koslow
(74) *Attorney, Agent, or Firm*—Pennie & Edmonds LLP

(57) ABSTRACT

There is disclosed a method of fabricating a piezoelectric ceramics. It can obtain a small grain size and a fine grain phase by forming a combined powder being major components, stirring the combined powder with $(COOH)_2$ water solution, dropping a $Pb(NO_3)_2$ water solution into the stirred powder, and forming a PZT powder by calcinations and sintering processes.

9 Claims, 4 Drawing Sheets

METHOD OF FABRICATING A PIEZOELECTRIC CERAMIC

FIELD OF THE INVENTION

The invention relates generally to a method of fabricating a piezoelectric ceramic. More particularly, the present invention relates to a method of fabricating a piezoelectric ceramic having a small grain size and a fine grain pattern.

BACKGROUND OF THE INVENTION

A piezoelectric ceramics is usually used in an ultrasonic transmit/receive device, an ultrasonic wave transducer for non-destructive, a fish finder, an optical set, an optical modulator color filter, an actuator for controlling combustible gases, a special use piezoelectric devices, etc.

Conventionally, as a method of mixing the PZT power being a raw materials of a piezoelectric ceramics, a solid phase reactive method is usually employed by which major components of PbO, $ZrO_2$ and $TiO_2$ and the impurity material of $Nb_2O_5$, etc are mixed and are then calcined. Recently, however, a composite powder method including a chemical method such as alcoholcide method, coprecipitation method, a multi-step wet method, etc. is attempted.

The composite powder obtained by chemical method is extremely fine and can maintain its grain pattern intact because it does not experience a mixing crushing process. Thus, as intrusion of the impurity can be prevented, the chemical method has a superior characteristic to a calcination powder obtained by the conventional solid phase reactive method. However, in manufacturing the PZT ceramics, the solid phase reactive method has been still mainly employed but the chemical method has not been practical. The reason is that if the PZT is combined by the chemical method, the manufacturing process is complex and the product cost is high.

Meanwhile, with crushing technology advanced, the powder combined by the conventional method is crushed into up to sub-micron. This crushing technology is a lot employed to fabricate various types of ceramics in view of a low temperature sintering.

As mentioned above, a method of making a fine powders and sintering it at low temperature can be mainly classified into a method of combining a powder body using a chemical method and a method of combining the powder body by solid phase reactive method using the material mechanically finely crushed. Any of these methods has their purpose to miniaturize the grain of the powder and increase uniformity of the composition, thus improving the electrical characteristic even at low temperature.

FIG. 1 is a flowchart for explaining the conventional method of fabricating the piezoelectric ceramics.

Referring now to FIG. 1, the major components, $ZrO_2$ and TiO, and an inpurity, $Nb_2O_5$ are first weighed depending on a $(Zr_{0.53}Ti_{0.47})Nb_{0.0102}$ oquation and mixed by ball mill for 6 hours (S101). Then, a first calcinations process is performed at the temperature of 1400° C. for 6 hours to make a NZTO solid solution powder (S102 and S103). In order to make this NZTO powder much fine, it is finely crushed by a 2.5 zirconium ball for 12 hours. Then, in order to satisfy the following [Chemical Equation 1], PbO is added to the NZTO powder thus fabricated. After it is combined by ball mill for 6 hours (S104), a first dry process is performed (S105).

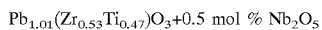 

$Pb_{1.01}(Zr_{0.53}Ti_{0.47})O_3 + 0.5$ mol % $Nb_2O_5$  (Chem Eq. 1)

Next, a second calcinations process is performed at the temperature of 710° C. for 3 hours (S106). Then, after it is crushed (S107), a second dry process is performed (S108). After PVA is added as a binder (S109), it is finally granulated (S110). Then, this granulated powder is weighed to fabricate a cylinder shape sample (S111). After a sintering process is performed (S112), the characteristic of the fabricated sample is measured (S113).

Referring to FIG. 2, it can be seen that the calcination temperature must be more than 900° C. in order to form a single phase.

However, the PZT powder of a piezoelectric ceramics fabricated by the above mentioned conventional method could not maintain its grain phase intact due to combined crushed process and has the possibility of introducing impurities. Also, there are problems that it requires a higher temperature in order to form a single phase and also needs a lot of processes.

SUMMARY OF THE INVENTION

It is therefore an object of the present invention to provide a method of fabricating a piezoelectric ceramics having a small grain size and a fine grain pattern by preventing intrusion of impurities upon manufacture of a piezoelectric ceramics.

In order to accomplish the above object, a method of fabricating a piezoelectric ceramics according to the present invention is characterized in that it comprises the steps of forming a combined powder being major components, stirring the combined powder with $(COOH)_2$ water solution, dropping a $Pb(NO_3)_2$ water solution into the stirred powder, and forming a PZT powder by calcinations and sintering processes.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
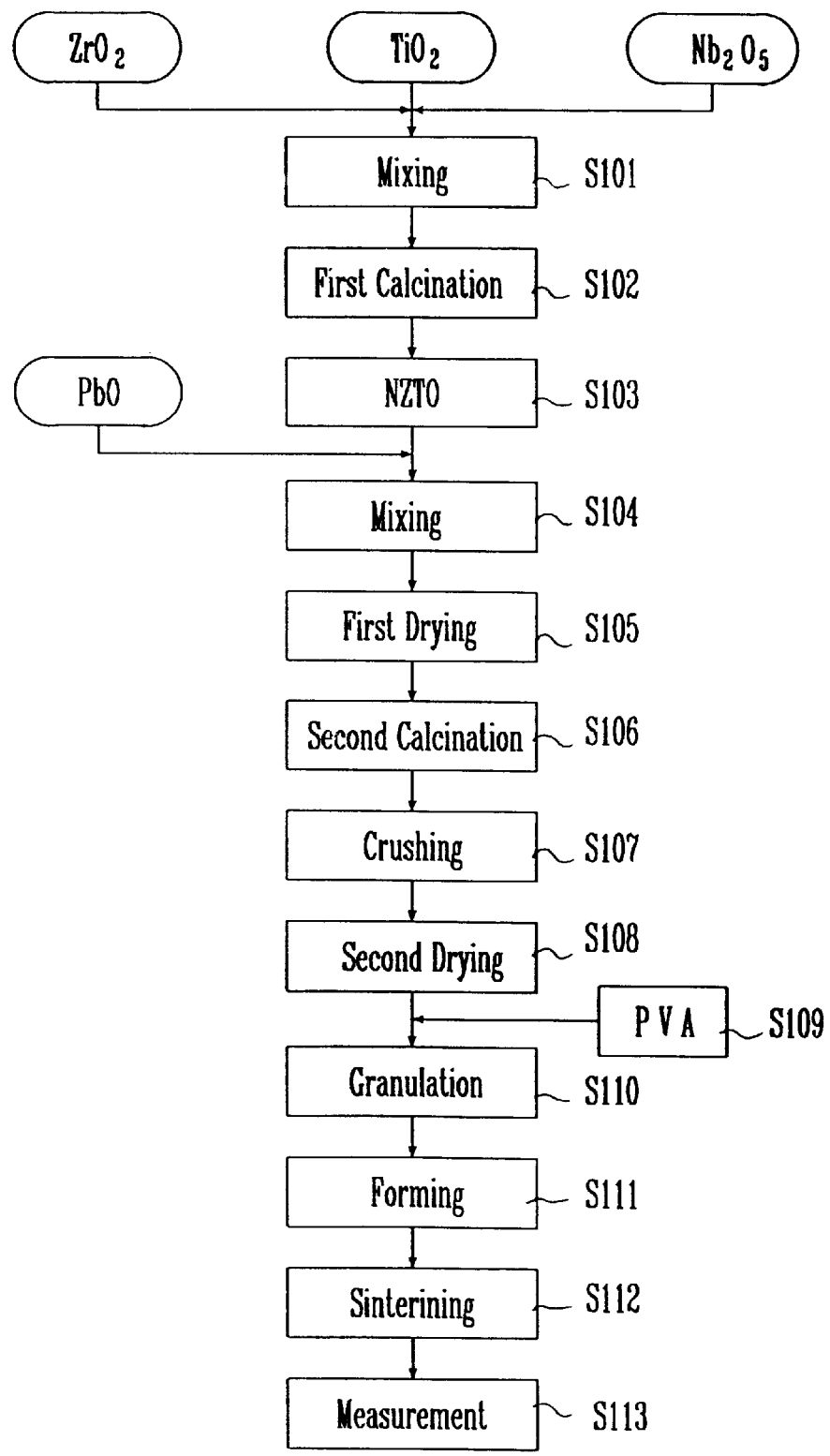
FIG. 1 is a flowchart for explaining a conventional method of fabricating a piezoelectric ceramics.
Figure 2A:
FIG. 2 is a graph shown to explain the characteristic in the X-ray diffraction analysis pattern of PZT powder fabricated according to the conventional method.
Figure 2B:
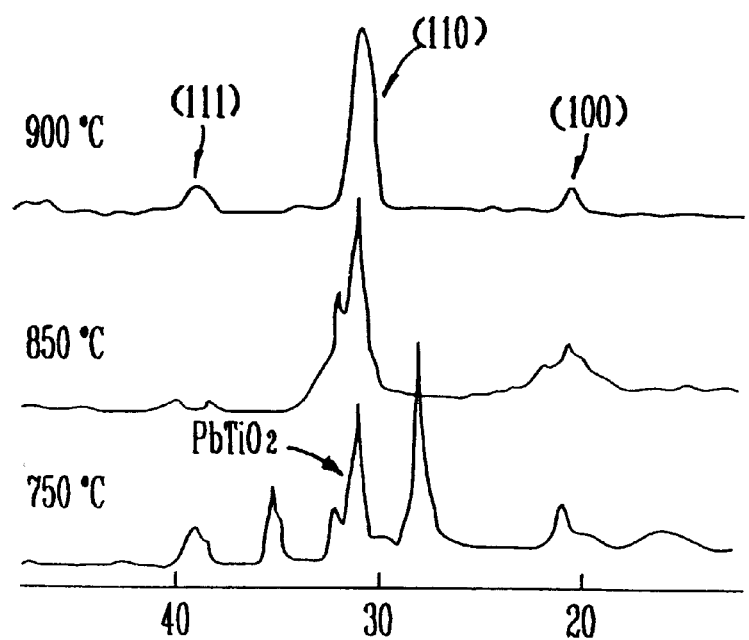

The present invention will be described in detail by way of a preferred embodiment with reference to accompanying drawings, in which like reference numerals are used to identify the same or similar parts.

Figure 3:
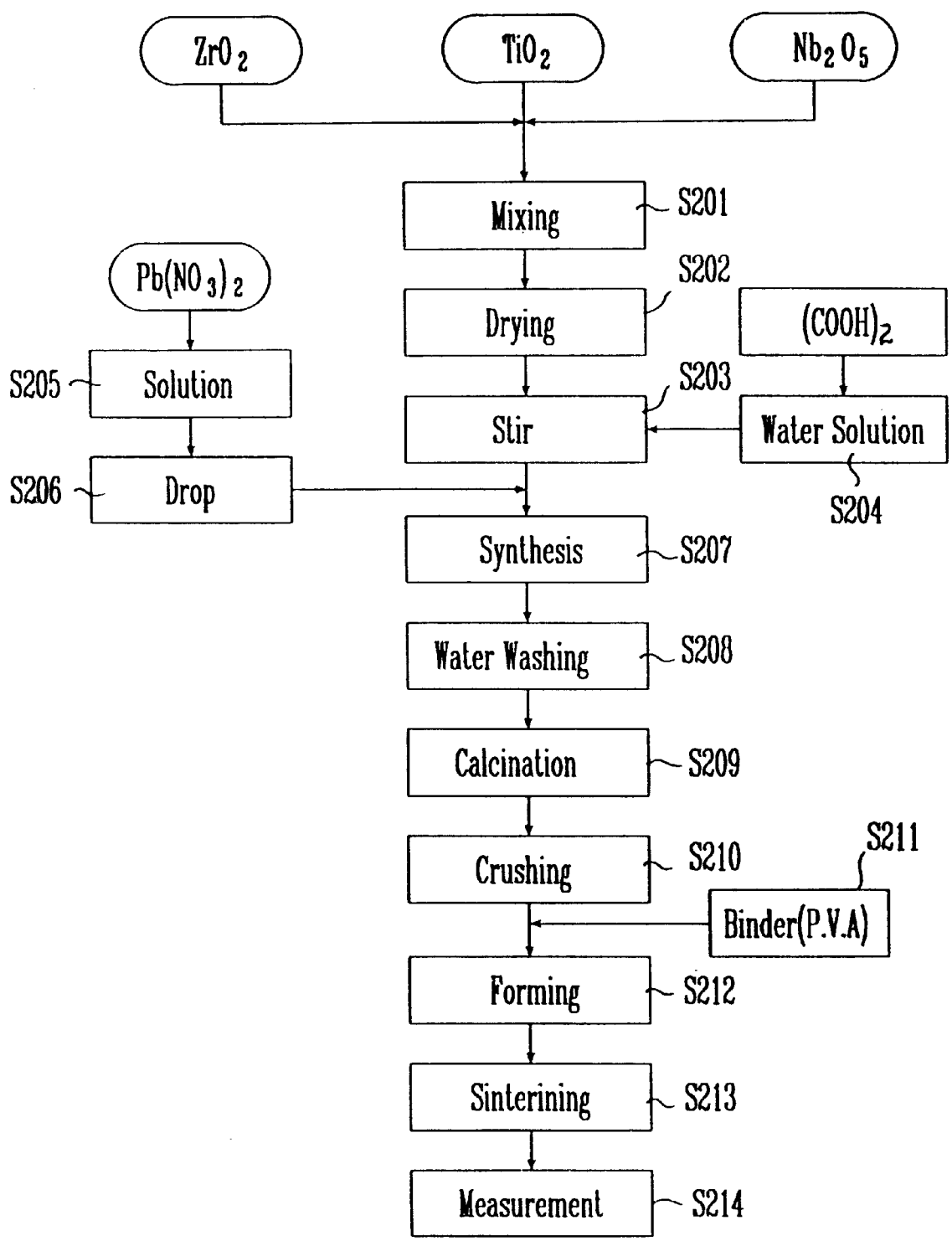
FIG. 3 is a flowchart for explaining a method of fabricating a piezoelectric ceramics according to the present invention.
Figure 4A:
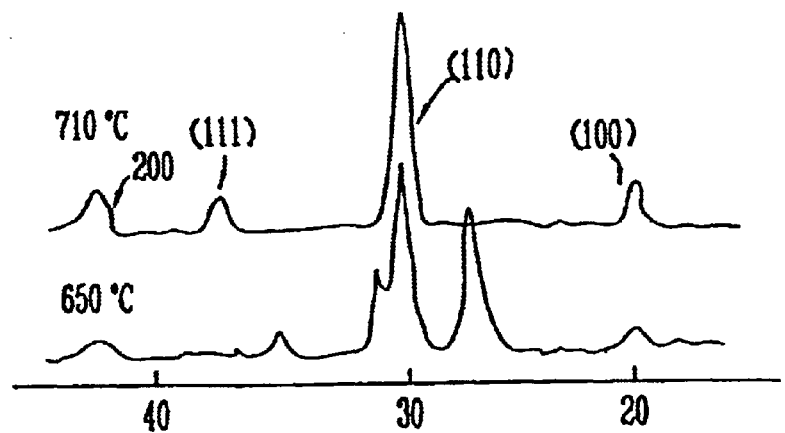
FIGS. 4A and 4B are diagrams for explaining the characteristic in the diffraction analysis pattern of a material fabricated by the method of the present invention.
Figure 4B:
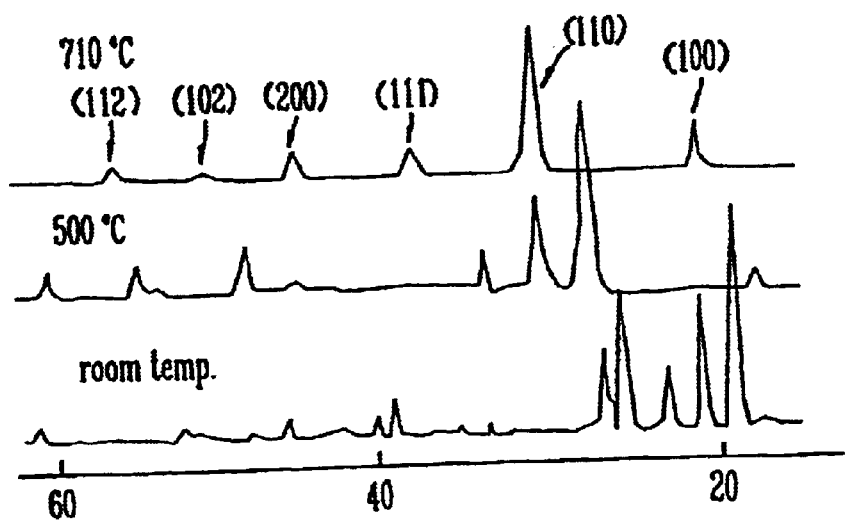

FIG. 3 is a flowchart for explaining a method of fabricating a piezoelectric ceramics according to the present invention.

Referring now to FIG. 3, $ZrO_2$, $TiO_2$ and $Nb_2O_5$ in the major components of $Zr_2$, $TiO_2$ and an impurity of $Nb_2O_5$ are first weighed depending on a $(Zr_{0.53}Ti_{0.47})$ $Nb_{0.01}O_2$ equation, are combined by ball mill for 6 hours (S201) and are then dried (S202). Thereafter, the $ZrO_2$, $TiO_2$ and $Nb_2O_5$ combined powder is immersed into a $(COOH)_2 \cdot 2H_2O$ of oxalic acid water solution at room temperature and is then sufficiently distributed by a magnetic stirrer for 30 minutes (S203 and S204). Then, a $Pb(NO_3)_2$ water solution is dropped into the $(COOH)_2 \cdot 2H_2O$ of oxalic acid water solution (S205 and S206). At this time, $PbC_2O_4$ being a white deposit is created from the $Pb(NO_3)_2$ and $(COOH)_2$. The synthesized product, $ZrO_2/TiO_2/Nb_2O_5+PbC_2O_4$, is formed by combining $PbC_2O_4$ and $ZrO_2/TiO_2/Nb_2O_5$ (S207). Thus, a by-product, a nitric water solution is left. Then, the nitric water solution is cleaned with distilled water until it will not be detected (S208) and is then dried.

Next, a calcination process is performed at the temperature of 710° C. for 10 hours (S209) to thus form a PZT powder. In order for the grains to be more fine and uniform, it is crushed with ball mill for 6 hours (S210) and is then dried. At this time, 1 wt % of 5 wt % PVA is added as a binder (S211).

Then, the resulting product is weighed by 1.5 g and a cylindrical sample having 15 mm in diameter is thus produced by pressure of 98 MPa (S212). Next, after the sample is immersed into a magnesia-made furnace, it is experienced by thermal process at the temperature of 500° C. for 6 hours in the air. Thereafter, it is experienced by a sintering process at the temperature of 850~1150° C. for 3 hours (S213) thus completing a sample. The completed sample is cleaned with an ultrasonic cleanser and silver electrodes are then attached on both sides of the sample. Then, the sample is experienced by annealing process at the temperature of 800° C. for 10 minutes. After the sampled is experienced by a polarizing process, in a silicon oil of 120° C., by which a direct electric field of 3 KV/mm is applied for 30 minutes, the characteristic of the produced sample is measured (S214).

Referring to FIGS. 5A & 5B, it could be also seen that a single phase is formed at the temperature of 900° C. that is lower than, the conventional calcination temperature.

As mentioned above, the present invention can obtain a high-purity powder by preventing intrusion of impurities and can also improve an electrical-mechanical combination function and a mechanical quality because a single PZT is formed even at low temperature.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of fabricating a piezoelectric powder, comprising the steps of:

combining $ZrO_2$, $TiO_2$, and an impurity of $Nb_2O_5$ to form a combined powder;

stirring said combined powder with $(COOH)_2$ water solution;

dropping a $Pb(NO_3)_2$ water solution into said stirred, combined powder; and forming a PZT powder by calcination and crushing processes.

2. The method according to claim 1, wherein said step of stirring is performed by a magnetic stirrer for 30 minutes.

3. The method according to claim 1, wherein said calcination process is performed at the temperature of 710° C. for 10 hours.

4. A method of fabricating a piezoelectric ceramic, comprising the steps of:

combining $ZrO_2$ and $TiO_2$ and an impurity of $Nb_2O_5$ to form a combined powder;

stirring said combined powder with $(COOH)_2$ water solution to thereby form a stirred mixture;

introducing a $Pb(NO_3)_2$ water solution into said stirred mixture; and forming a PZT ceramic by calcination and sintering processes.

5. The method according to claim 4, comprising the step of removing nitric water solution after the step of introducing a $Pb(NO_3)_2$ water solution.

6. The method according to claim 4, wherein said step of stirring is performed by a magnetic stirrer for 30 minutes.

7. The method according to claim 4, wherein said calcination process is performed at the temperature of 710° C. for 10 hours.

8. The method according to claim 4, wherein said sintering process is performed at the temperature of 850 to 1150° C. for 3 hours.

9. The method according to claim 4, wherein only a single calcination process is used to form the piezoelectric ceramic.

* * * * *